US005808491A

United States Patent [19]

Delano

[11] Patent Number: 5,808,491

[45] Date of Patent: Sep. 15, 1998

[54] METHOD AND APPARATUS FOR SENSING A COMMON MODE VOLTAGE

[75] Inventor: Cary Delano, San Jose, Calif.

[73] Assignee: Tripath Technology, Inc., Santa Clara, Calif.

[21] Appl. No.: 740,301

[22] Filed: Oct. 25, 1996

[51] Int. Cl.[6] .......... H03D 3/00

[52] U.S. Cl. .......... 327/104; 327/354

[58] Field of Search .......... 327/104, 354, 327/62, 334, 560

[56] References Cited

U.S. PATENT DOCUMENTS

| | | | |
|---|---|---|---|
| 3,944,906 | 3/1976 | Hill et al. | 327/104 |
| 4,307,305 | 12/1981 | Morris | 327/104 |
| 4,647,861 | 3/1987 | Petritis et al. | 327/104 |
| 4,704,546 | 11/1987 | Mallick, Jr. et al. | 327/63 |
| 4,705,969 | 11/1987 | Gross | 327/102 |
| 5,568,561 | 10/1996 | Whitlock | 330/258 |

*Primary Examiner*—Toan Tran
*Attorney, Agent, or Firm*—Townsend and Townsend and Crew LLP

[57] ABSTRACT

A method and apparatus are provided for sensing a common mode signal of a differential circuit. A first full wave rectifier samples the differential signal and generates a first rectified signal. A second full wave rectifier samples the differential signal and generates a second rectified signal. An averaging circuit coupled to the first and second full wave rectifiers averages the first and second rectified signals and generates the common mode signal.

10 Claims, 3 Drawing Sheets

METHOD AND APPARATUS FOR SENSING A COMMON MODE VOLTAGE

BACKGROUND OF THE INVENTION

The present invention relates to differential circuitry. More specifically, the present invention provides a method and an apparatus for sensing the common mode voltage of a variety of types of differential circuits.

The use of differential circuits in analog circuit designs has become quite common due to several advantages offered by differential circuits. For example, differential circuits exhibit reduced lower DC offsets, greater signal swing, better noise immunity, and greater simplicity of design than equivalent single-ended circuits. To take full advantage of the increased signal swing, care must be taken that the common mode voltage, i.e., the average voltage of the differential output terminals, is set halfway between the supply voltages, e.g., $+V_{cc}$ and ground. Therefore, it is necessary to monitor the common mode voltage and provide continuous feedback thereof for the purpose of maintaining the common mode voltage at the desired level.

In the past, there have been a variety of ways in which the sensing and setting of common mode voltages in differential circuits have been accomplished. FIGS. 1 and 2 show two common techniques for monitoring the common mode voltage of a generic differential circuit 100 which is modeled by four current sources 102, 104, 106, and 108. Current sources 110 and 112 represent the small signal inputs to differential circuit 100. This structure is a model of the internal gain stage of many common op amps. However, as drawn, circuit 100 requires an apparatus to control the common mode voltage of nodes 118 and 120 to prevent it from drifting to $V_{cc}$ or ground.

In FIG. 1, a simple resistor divider comprising resistors 114 and 116 is employed to monitor the differential output between terminals 118 and 120. The resulting common mode voltage at node 122 is then fed back to current sources 102 and 104 for the purpose of adjusting the voltages at terminals 118 and 120 and thereby the common mode voltage. This technique allows for accurate measurement and setting of the common mode voltage at the desired level, i.e., halfway between $+V_{cc}$ and ground. As a result, the differential output may theoretically vary from rail-to-rail, i.e., between $+V_{cc}$ and ground, without clipping. Unfortunately, the use of a resistor divider negatively affects the output impedance of differential circuit 100. That is, instead of the very high output impedance typically seen between terminals 118 and 120, the output impedance is reduced to the parallel combination of resistors 114 and 116. As will be understood, the degradation of the output impedance of differential circuit 100 is undesirable. For example, in the aforementioned op amp, this degradation of output impedance would reduce the open loop gain of the device.

The sensing circuit of FIG. 2 solves the problem of output impedance degradation by buffering differential terminals 118 and 120 with pmos devices 202 and 204 before measuring the common mode voltage with resistors 206 and 208. The voltage drop across devices 202 and 204 is regained via pmos device 210 before the resulting common mode voltage (at node 212) is fed back to current sources 102 and 104. Because of the isolation provided by device 202 and 204, the output impedance of differential circuit 100 is substantially unaffected by the monitoring of the common mode voltage. Unfortunately, because of the limitations of the real transistors used to implement current sources 214 and 216, and the voltage drop represented by devices 202 and 204, the voltage swing of the differential signal is limited to something less than the full rail-to-rail range. As will be understood, the limitation on the output voltage swing of differential circuit 100 is also undesirable.

It is therefore desirable to provide a means for sensing and setting the common mode voltage of a differential circuit which does not degrade the output impedance of the differential circuit and allows for the maximum differential voltage swing.

SUMMARY OF THE INVENTION

The present invention provides a method and apparatus for sensing and feeding back the common mode voltage of a differential circuit which does not degrade the circuit's output impedance and which allows for the output to vary from rail to rail. Specifically, the present invention samples the differential output using a pair of full wave rectifiers which have the effect of isolating the output terminals from the common mode voltage measurement without the undesirable "clipping" effect introduced by the buffering technique of FIG. 2. A top side full wave rectifier receives the signal on one of the differential output terminals as an input and generates a full wave rectified signal. The rectified signal is then averaged with a second full wave rectified signal from a bottom side full wave rectifier which receives the signal on the other differential output terminal as its input. Because of the manner in which the full wave rectifiers are biased, the signals on the differential outputs are able to vary from rail to rail.

Thus, according to the present invention, a method and apparatus are provided for sensing a common mode signal of a differential circuit. A first full wave rectifier samples the differential signal and generates a first rectified signal. A second full wave rectifier samples the differential signal and generates a second rectified signal. An averaging circuit coupled to the first and second full wave rectifiers averages the first and second rectified signals and generates the common mode signal.

According to more specific embodiments, feedback circuitry feeds the common mode signal back to the differential circuit, and the differential signal's common mode is adjusted in response to the feedback.

A further understanding of the nature and advantages of the present invention may be realized by reference to the remaining portions of the specification and the drawings.

DESCRIPTION OF THE PREFERRED EMBODIMENT

Figure 3:
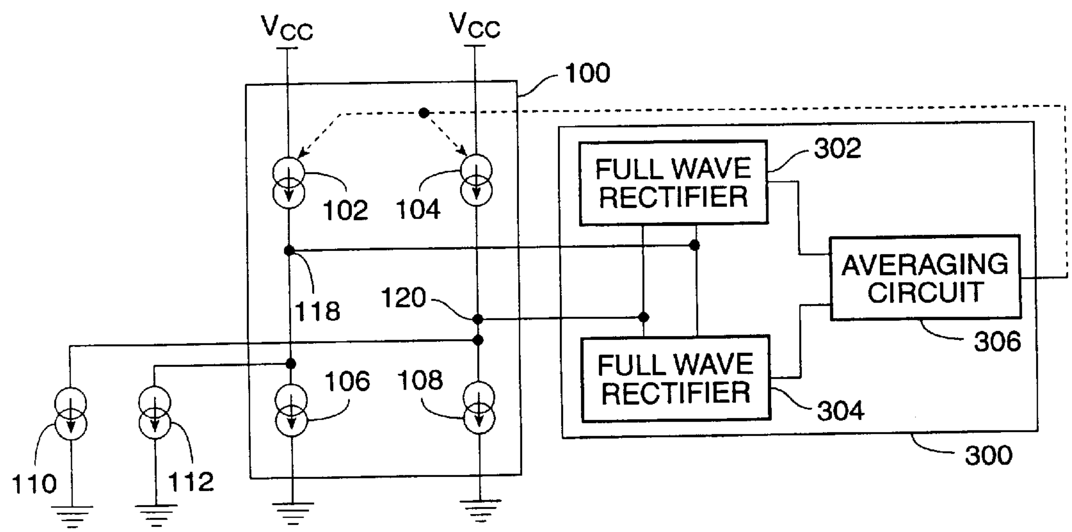
FIG. 3 is a simplified block diagram of a sensing circuit for sensing the common mode voltage of a differential circuit according to the present invention.

FIG. 3 is a simplified block diagram of a sensing circuit 300 for sensing the common mode voltage of a differential circuit 100 according to the present invention. Sensing circuit 300 includes full wave rectifiers 302 and 304 each of which generates a full wave rectified waveform from the differential output signal of differential circuit 100. The rectified waveform from rectifier 302 lies between $+V_{cc}$ and the common mode voltage, $V_{cm}$, and the rectified waveform from rectifier 304 lies between $V_{cm}$ and ground. The rectified waveforms are averaged in averaging circuit 306 to generate $V_{cm}$ which is fed back and used to adjust current sources 102 and 104 (as indicated by the dashed line) so that $V_{cm}$ is maintained at the desired level, i.e., generally $+V_{cc}/2$.

Figure 4:
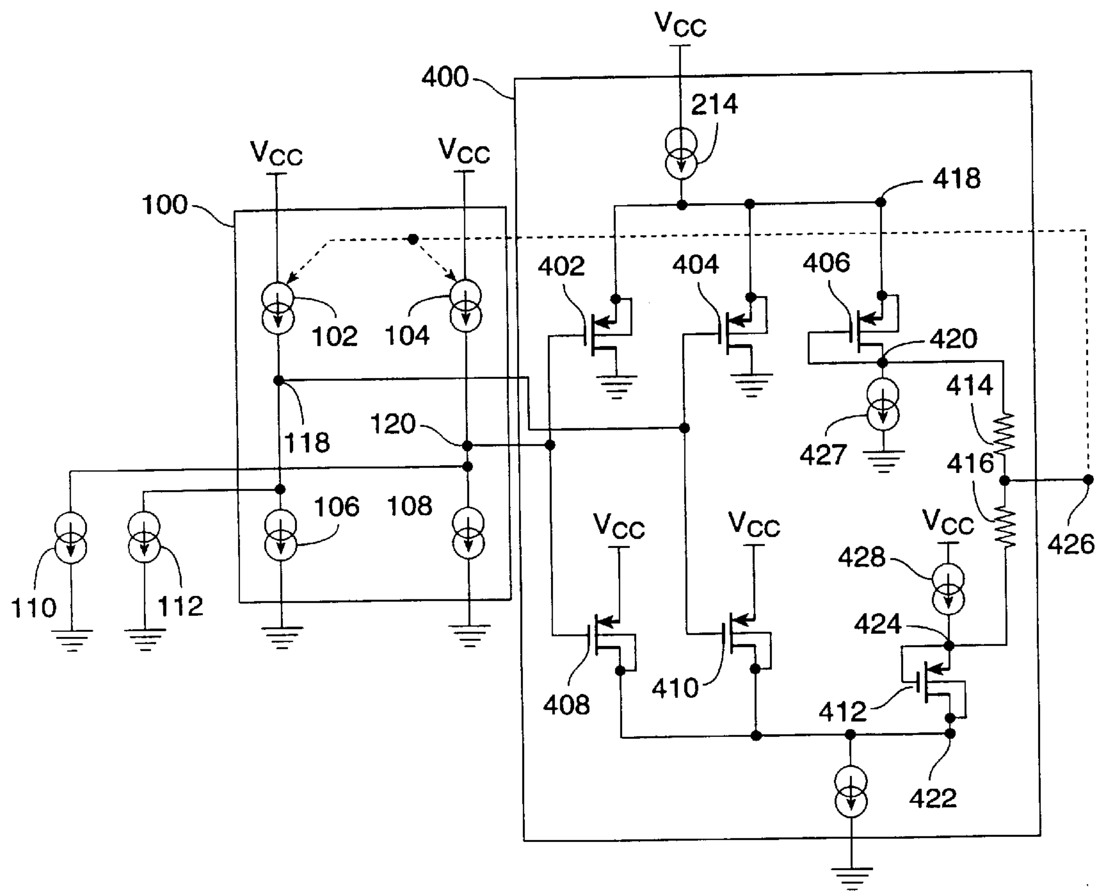
FIG. 4 is a more detailed diagram of a sensing circuit for sensing the common mode voltage of a differential circuit according to a specific embodiment of the present invention.

FIG. 4 is a more detailed diagram of a sensing circuit 400 for sensing the common mode voltage of a differential circuit 100 according to a specific embodiment of the present invention. Like sensing circuit 300, sensing circuit 400 includes two full wave rectifiers which generate full wave rectified waveforms from the differential output signal of differential circuit 100. One of the full wave rectifiers comprises pmos devices 402, 404, and 406. The other comprises nmos devices 408, 410, and 412. The averaging circuit comprises a network of resistors 414 and 416.

Figure 1:
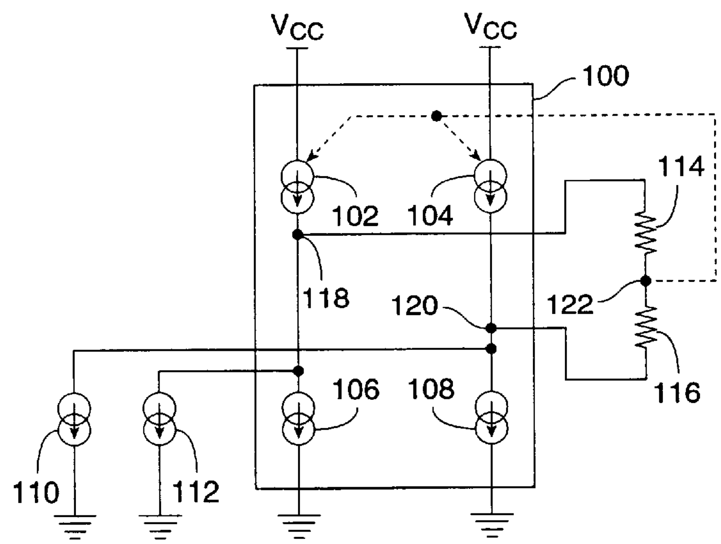
FIG. 1 is a simplified diagram of a first technique for sensing the common mode voltage of a differential circuit according to the prior art.
Figure 2:
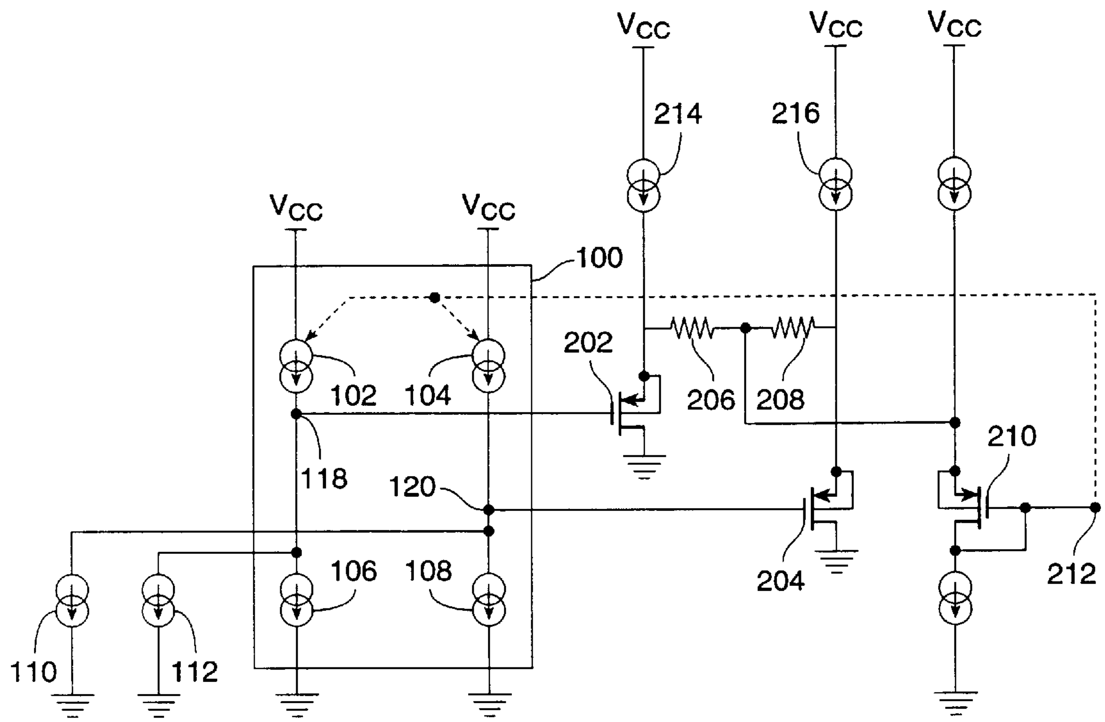
FIG. 2 is a simplified diagram of a second technique for sensing the common mode voltage of a differential circuit according to the prior art.
Figure 5:
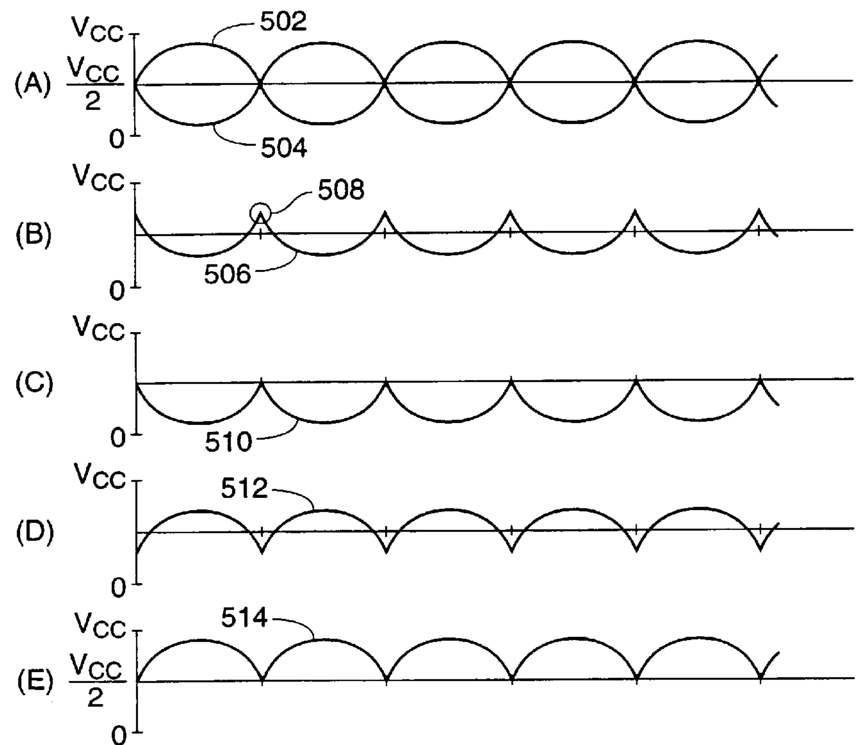
FIGS. 5A–E are representations of signals at various nodes of sensing circuit 400 of FIG. 4.

The bottom side full wave rectifier (pmos devices 402, 404, and 406) generates a full wave rectified waveform as will be described with reference to FIGS. 5A–C. FIG. 5A shows the waveforms 502 and 504 at terminals 118 and 120, respectively, of differential circuit 100. As can be seen, these waveforms swing from $+V_{cc}$ to ground, i.e., from rail to rail, and have a common mode voltage equal to $+V_{cc}/2$. FIG. 5B shows the rectified waveform 506 generated at node 418 by devices 402 and 404. As shown, devices 402 and 404 transmit only the lower, i.e., bottom, side of the differential signal. The active one of devices 402 and 404 is always biased to a voltage equal to or less than the common mode voltage. Thus, this active device will not turn off or "clip"for a rail-to-rail differential signal as with the device shown in FIG. 2. There is some crossover distortion such as, for example, in region 508 where device 402 turns off and device 404 turns on. However, if devices 402, 404, 408, and 410 are carefully ratioed, this distortion is largely cancelled by similar distortion from the top side full wave rectifier. FIG. 5C shows the rectified waveform 510 at node 420 after device 406 offsets the voltage step up introduced across devices 402 and 404.

The top side full wave rectifier (nmos devices 408, 410, and 412) generates a full wave rectified waveform as will be described with reference to FIGS. 5D and 5E. FIG. 5D shows the rectified waveform 512 generated at node 422 by devices 408 and 410. As shown, devices 408 and 410 transmit only the upper, i.e., top, side of the differential signal. In this case, the active one of nmos devices 408 and 410 is always biased to a voltage greater than or equal to the common mode voltage, thereby also preventing clipping for a rail-to-rail differential signal. As discussed above, if nmos devices 408 and 410 are properly selected with respect to pmos devices 402 and 404, the crossover distortion in waveform 512 is largely cancelled by the similar distortion in waveform 506 when the waveforms are combined. FIG. 5E shows the rectified waveform 514 at node 424 after device 412 offsets the voltage drop introduced across devices 408 and 410.

Referring now to waveforms 510 and 514 of FIGS. 5C and 5E, respectively, it can be seen that when these waveforms are combined and averaged by resistors 414 and 416 the observed common mode voltage at node 426 is $+V_{cc}/2$ as expected from waveforms 502 and 504. Minor limitations of the performance are caused by current sources 427 and 428, but this can be minimized by using MOS devices biased with small gate overdrives. Also, for biasing at $V_{cc}/2$, the voltage drops across devices 427 and 428 can be made to cancel, providing for true rail-to-rail operation. Thus, even where a rail-to-rail differential signal is encountered, the sensing circuit of the present invention is operable to monitor the common mode voltage without degrading the output impedance of the differential circuit or the accuracy of measurement.

Figure 6:
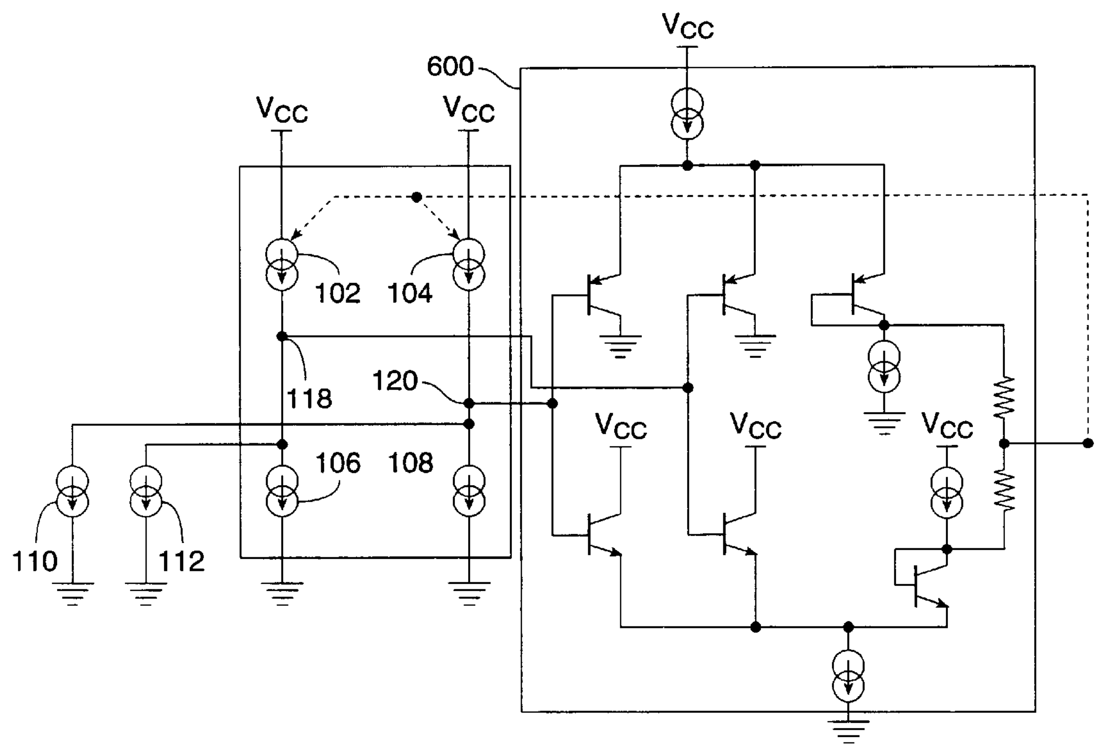
FIG. 6 is a diagram of another specific embodiment of the invention.

While the invention has been particularly shown and described with reference to specific embodiments thereof, it will be understood by those skilled in the art that the foregoing and other changes in the form and details may be made therein without departing from the spirit or scope of the invention. For example, the present invention has been described primarily with regard to implementation using field effect transistor technology, but it will be understood that the invention may just as easily be implemented using bipolar transistor technology. Further, the feedback from FIG. 4 (node 426) could be sent to devices 106 and 108 instead of devices 102 and 104. An example of such an embodiment is shown by sensing circuit 600 of FIG. 6. The scope of the invention should therefore be determined by reference to the appended claims.

What is claimed is:

1. A sensing circuit for sensing a common mode signal of a differential circuit, the differential circuit having a differential signal associated therewith, the sensing circuit comprising:

- a first full wave rectifier for sampling the differential signal and generating a first rectified signal;
- a second full wave rectifier for sampling the differential signal and generating a second rectified signal; and
- an averaging circuit coupled to the first and second full wave rectifiers for averaging the first and second rectified signals and generating the common mode signal.

2. The sensing circuit of claim 1 wherein the first full wave rectifier comprises a plurality of n-type semiconductor devices, and the second full wave rectifier comprises a plurality of p-type semiconductor devices.

3. The sensing circuit of claim 2 wherein the differential signal lies between first and second terminals, the plurality of n-type semiconductor devices comprises a first n-type device coupled to the first terminal, a second n-type device coupled to the second terminal, and a third n-type device coupled to the first and second n-type devices, and the plurality of p-type semiconductor devices comprises a first p-type device coupled to the first terminal, a second p-type device coupled to the second terminal, and a third p-type device coupled to the first and second p-type devices and the averaging circuit.

4. The sensing circuit of claim 2 wherein the plurality of n-type semiconductor devices comprises npn bipolar transistors, and the plurality of p-type semiconductor devices comprises pnp bipolar transistors.

5. The sensing circuit of claim 2 wherein the plurality of n-type semiconductor devices comprises nmos field effect transistors, and the plurality of p-type semiconductor devices comprises pmos field effect transistors.

6. The sensing circuit of claim 1 wherein the averaging circuit comprises a plurality of impedances connected to a common node.

7. The sensing circuit of claim 1 further comprising feedback circuitry for feeding the common mode signal back to the differential circuit.

8. A method for sensing a common mode signal of a differential circuit, the differential circuit having a differential signal associated therewith, the method comprising the steps of:

sampling the differential signal with a first full wave rectifier thereby generating a first rectified signal;

sampling the differential signal with a second full wave rectifier thereby generating a second rectified signal; and averaging the first and second rectified signals thereby generating the common mode signal.

9. The method of claim 8 further comprising the step of feeding the common mode signal back to the differential circuit.

10. The method of claim 9 further comprising the step of adjusting the differential signal in response to the feeding back step.

* * * * *